United States Patent
Deceglie

(10) Patent No.: US 10,622,941 B2
(45) Date of Patent: Apr. 14, 2020

(54) REAL-TIME SERIES RESISTANCE MONITORING IN PHOTOVOLTAIC SYSTEMS

(71) Applicant: Alliance for Sustainable Energy, LLC, Golden, CO (US)

(72) Inventor: Michael Gardner Deceglie, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 264 days.

(21) Appl. No.: 15/564,357

(22) PCT Filed: Apr. 8, 2016

(86) PCT No.: PCT/US2016/026632
§ 371 (c)(1),
(2) Date: Oct. 4, 2017

(87) PCT Pub. No.: WO2016/164718
PCT Pub. Date: Oct. 13, 2016

(65) Prior Publication Data
US 2018/0131322 A1    May 10, 2018

Related U.S. Application Data

(60) Provisional application No. 62/146,026, filed on Apr. 10, 2015.

(51) Int. Cl.
*H02S 50/10* (2014.01)
*H02S 50/00* (2014.01)
*G01R 31/40* (2020.01)
*G01R 19/00* (2006.01)
*G01R 27/02* (2006.01)
*H02S 40/30* (2014.01)

(52) U.S. Cl.
CPC .............. *H02S 50/10* (2014.12); *G01R 19/00* (2013.01); *G01R 27/02* (2013.01); *G01R 31/40* (2013.01); *H02S 40/30* (2014.12); *H02S 50/00* (2013.01)

(58) Field of Classification Search
CPC .................................. H02S 50/00; H02S 50/10
See application file for complete search history.

(56) References Cited

U.S. PATENT DOCUMENTS

| 8,224,598 B2 * | 7/2012 | Wu .......................... H02S 50/10 702/182 |
| 8,964,435 B2 | 2/2015 | Wagoner et al. |

(Continued)

FOREIGN PATENT DOCUMENTS

WO    WO 2014/144337 A1    9/2014

OTHER PUBLICATIONS

Bowden, S. et al., "Rapid and Accurate Determination of Series Resistance and Fill Factor Losses in Industrial Silicon Solar Cells," 17th European Photovoltaic Solar Energy Conference, Oct. 22-26, 2001, 5 pages.

(Continued)

*Primary Examiner* — Walter L Lindsay, Jr.
*Assistant Examiner* — Milton Gonzalez
(74) *Attorney, Agent, or Firm* — Robert G. Pittelkow

(57) ABSTRACT

A device includes at least one processor configured to determine a target irradiance value based on an operating current value of a photovoltaic (PV) device, a short-circuit current value of the PV device, and an operating irradiance value of the PV device. The at least one processor is also configured to determine an open-circuit voltage value of the PV device at the target irradiance value, determine a series resistance value of the PV device based on an operating voltage value of the PV device, the operating current value, and the open-circuit voltage value at the target irradiance value, and execute at least one programmatic action based on the series resistance value.

20 Claims, 7 Drawing Sheets

(56) References Cited

U.S. PATENT DOCUMENTS

| | | | |
|---|---|---|---|
| 2009/0133735 A1 | 5/2009 | Yuguchi et al. | |
| 2012/0043988 A1 | 2/2012 | Ramsey et al. | |
| 2012/0111391 A1 | 5/2012 | Shamseldein et al. | |
| 2012/0239322 A1 | 9/2012 | Sato et al. | |
| 2012/0319489 A1 | 12/2012 | McCaslin et al. | |
| 2013/0088252 A1* | 4/2013 | Brabetz | G01R 31/026 324/761.01 |
| 2013/0300449 A1* | 11/2013 | Nakamura | H01L 31/02021 324/761.01 |
| 2013/0311121 A1* | 11/2013 | Kohno | H02S 50/10 702/64 |
| 2014/0333319 A1* | 11/2014 | Sinton | H02S 50/10 324/501 |

OTHER PUBLICATIONS

Deceglie, M. et al., "Real-Time Series Resistance Monitoring in PV Systems Without the Need for I-V Curves," IEEE Journal of Photovoltaics, vol. 5, No. 6, Nov. 2015, pp. 1706-1709.

Forsyth, M. et al., "Use of the Suns-Voc for Diagnosing Outdoor Arrays & Modules," 40th Photovoltaic Specialist Conference, Jun. 8-13, 2014, pp. 1928-1931.

Marion, W. et al., "User's Manual for Data for Validating Models for PV Module Performance," NREL Technical Report, NREL/TP-5200-61610, Apr. 2014, 49 pages.

Sera, D. et al., "Photovoltaic Module Diagnostics by Series Resistance Monitoring and Temperature and Rated Power Estimation," 34th Annual Conference of the IEEE Industrial Electronics Society, Nov. 10-13, 2008, pp. 2195-2199.

Sinton, R. et al., "A Quasi-Steady-State Open-Circuit Voltage Method for Solar Cell Characterization," 16th European Photovoltaic Solar Energy Conference, May 1-5, 2000, 4 pages.

Stein, J. et al., "Measuring PV System Series Resistance Without Full IV Curves," IEEE 40th Photovoltaic Specialist Conference, Jun. 8-13, 2014, pp. 2032-2036.

International Search Report dated Jul. 11, 2016 from corresponding PCT patent application No. PCT/US16/26632, 2 pages.

Written Opinion of the International Searching Authority dated Jul. 11, 2016 from corresponding PCT patent application No. PCT/US16/26632, 7 pages.

* cited by examiner

REAL-TIME SERIES RESISTANCE MONITORING IN PHOTOVOLTAIC SYSTEMS

CROSS-REFERENCE TO RELATED APPLICATIONS

This application claims the benefit of International Application PCT/US2016/026632, filed Apr. 8, 2016, and U.S. Provisional Application No. 62/146,026, filed Apr. 10, 2015, the entire content of each of which is incorporated herein by reference.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

Related art systems often monitor the condition of photovoltaic (PV) devices or systems based almost entirely on the energy that they produce, sometimes normalized by the systems' expected output based on the solar resource and the ambient temperature. This type of monitoring can identify major problems, but only after they have already had a major effect on the energy output. This poor sensitivity leads to high uncertainty in the future output of a PV system. Once a drop in yield is detected, a reactive, expensive chain of manual troubleshooting steps is initiated to identify and remediate the problem.

Further, occasional and superficial maintenance visits may fail to detect incipient problems before they lead to lost production and safety hazards. These increase the investment risk in utility-scale solar electricity, resulting in higher financing costs. If and when reduced energy production is detected, information about the specific cause can only be found using costly and labor-intensive manual techniques, adding to operations and maintenance cost and reducing yield until the problem is addressed. In addition, there is emerging pressure to improve monitoring and periodic inspections of PV systems, and to identify causes and trends in failures, so that performance and safety problems can be promptly resolved through maintenance or warranty claims.

SUMMARY

Described herein are systems, devices, and methods for real-time monitoring of the series resistance of PV devices.

In one example, a device includes at least one processor configured to determine a target irradiance value based on an operating current value of a photovoltaic (PV) device, a short-circuit current value of the PV device, and an operating irradiance value of the PV device. The at least one processor may also be configured to determine an open-circuit voltage value of the PV device at the target irradiance value, determine a series resistance value of the PV device based on an operating voltage value of the PV device, the operating current value, and the open-circuit voltage value at the target irradiance value, and execute at least one programmatic action based on the series resistance value.

In another example, a method includes determining, by a processor, a target irradiance value based on an operating current value of a photovoltaic (PV) device, a short-circuit current value of the PV device, and an operating irradiance value of the PV device. The method may further include determining, by the processor, an open-circuit voltage value of the PV device at the target irradiance value, determining, by the processor, a series resistance value of the PV device based on an operating voltage value of the PV device, the operating current value, and the open-circuit voltage value at the target irradiance value, and executing, by the processor, based on the series resistance value, at least one programmatic action to modify operation of the PV device.

In another example, a non-transitory computer-readable medium is encoded with instructions that, when executed, cause at least one processor to determine a target irradiance value based on an operating current value of a photovoltaic (PV) device, a short-circuit current value of the PV device, and an operating irradiance value of the PV device. The instructions may also cause the at least one processor to determine an open-circuit voltage value of the PV device at the target irradiance value, determine a series resistance value of the PV device based on an operating voltage value of the PV device, the operating current value, and the open-circuit voltage value at the target irradiance value, and execute at least one programmatic action based on the series resistance value.

The details of one or more examples are set forth in the accompanying drawings and the description below. Other features, objects, and advantages will be apparent from the description and drawings, and from the claims.

DETAILED DESCRIPTION

Figure 1:
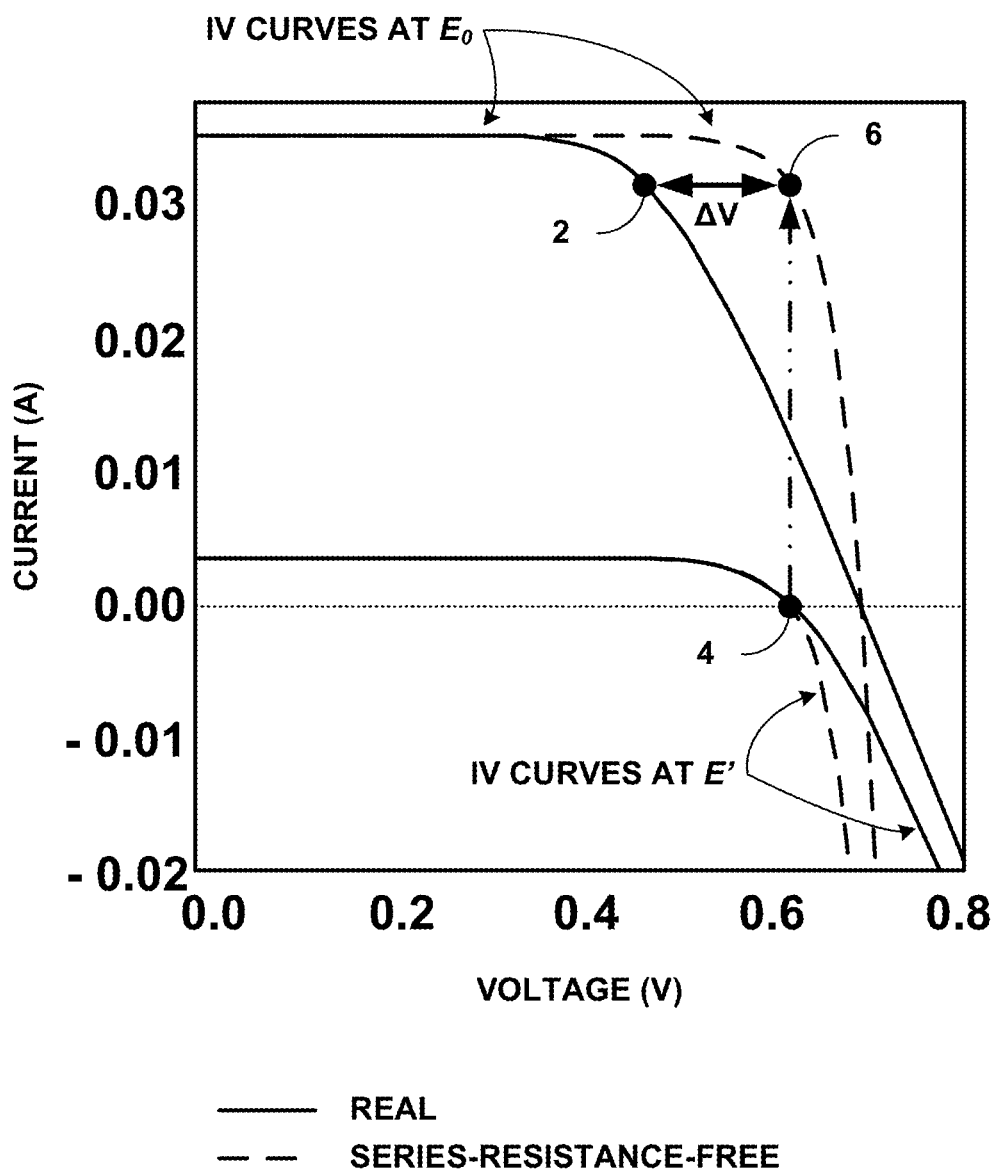
FIG. 1 is a graphical plot illustrating example values that may be used to determine the series resistance of a PV device, in accordance with one or more aspects of the present disclosure.

The present disclosure provides systems, devices, and methods for monitoring the series resistance of PV devices in real time. For example, a PV system inverter or other suitable device may determine (e.g., receive, measure, etc.) operating values for a PV device, such as a cell, a module, a string, a panel, including, in some examples, various additional PV system components (e.g., electrical connections, wires, etc.). Based on the operating values, the PV system inverter may determine a target irradiance value at which to determine an open-circuit voltage value of the PV device. The PV system inverter may determine the open-circuit voltage value at the target irradiance value. Based on operating voltage and current values of the PV device, and on the open-circuit voltage value at the target irradiance value, the PV system inverter may determine a real-time series resistance value of the PV device.

The techniques described herein build upon the suns-$V_{oc}$ analysis method, which may be used to measure the open-circuit voltage value $V_{oc}$ of a PV device as a function of the incident light intensity (i.e., suns) and construct a hypothetical series-resistance-free IV curve of the PV device. Leveraging the suns-$V_{oc}$ method may allow the techniques described herein to handle non-uniform series resistance well, in contrast to related art techniques that involve fitting or analyzing IV curves under the assumption of device uniformity.

Suns-$V_{oc}$ has historically been used for the analysis of PV devices under controlled laboratory conditions. Suns-$V_{oc}$ has also been shown to be useful in the analysis of PV devices and PV systems located outdoors. The techniques of the present disclosure extend the Suns-$V_{oc}$ analysis to develop a real-time series resistance (RTSR) method for automatically monitoring series resistance of PV devices in real time. As discussed in further detail below, RTSR may eliminate the need for collecting IV curves or constructing full series-resistance-free IV curves.

The RTSR method is based upon collection of low-irradiance $V_{oc}$ points, and comparison of those points to high-irradiance operating points. In contrast to related art methods for in situ series resistance tracking, RTSR is not empirical but rather physics-based. RTSR requires no calibration and it automatically adapts to other (e.g., non-series resistance) changes in the IV characteristic to provide accurate and robust monitoring of series resistance.

The goal of the related art suns-$V_{oc}$ method is to construct a series-resistance-free IV curve. Such a curve can be constructed for a reference irradiance $E_0$ from a set of $V'_{oc}$ points measured at irradiances E', where E' is less than $E_0$. The ($V'_{oc}$, E') data is transformed to voltage-current units using:

$$\left(V'_{oc}, I_{sc,0}\left(1 - \frac{E'}{E_0}\right)\right) \quad (1)$$

where $I_{sc,0}$ is the measured or estimated short-circuit current value of the device at the reference irradiance $E_0$. This process essentially samples the IV curve as it crosses through the I=0 axis, and assumes that superposition holds for the series-resistance-free curve. The sampled voltage values are then translated back up to the appropriate current using Equation (1). Rather than constructing the suns-$V_{oc}$ curve and comparing it to a full IV curve, the RTSR method compares a single operating point, ($V_0$, $I_0$), at an irradiance value $E_0$, to an appropriate $V'_{oc}$, in order to compute a series resistance value $R_s$.

FIG. 1 is a graphical plot illustrating example values that may be used to determine the series resistance of a PV device, in accordance with one or more aspects of the present disclosure. The curves and points shown in the example of FIG. 1 represent only one example of curves and values used for calculating series resistance as described herein, and various other curves and/or values may be used in other examples. The graphical plot of FIG. 1 includes points 2, 4, and 6.

In the example of FIG. 1, point 2 represents a voltage value $V_0$ and a current value $I_0$ of a PV device at an irradiance value $E_0$. In some examples, point 2 may represent real-time operating values of the PV device and thus point 2 may be referred to as the operating point of the device. For instance, the PV device may be experiencing an irradiance value $E_0$ and point 2 may represent the present current output and voltage output of the PV device. In some examples, point 2 may represent hypothetical operation values or historical (e.g., previously measured) operation values.

In the example of FIG. 1, point 4 represents an open-circuit voltage value $V'_{oc}$ of the PV device at a target irradiance value $E'_{target}$. As point 4 represents an open-circuit voltage value, the current value of the PV device at point 4 is zero. In some examples, point 4 may represent hypothetical operation values or historical (e.g., previously measured) operation values.

In the example of FIG. 1, point 6 represents a voltage value and current value of the PV device at $E_0$, if the PV device had no series resistance. That is, point 6 represents the voltage value and current value of a hypothetical version of the PV device that is free of any series resistance. The voltage and current values for point 6 may be determined based on the value of point 4, $E_0$, and $I_{sc,0}$ as described herein.

$E'_{target}$ may be determined based on an operating current value of the PV device (e.g., as defined by point 2) along with an operating irradiance value $E_0$ of the PV device and a measured or estimated short-circuit current value of the PV device at the operating irradiance value $E_0$. As one example, the following equation may be used to calculate the irradiance of an appropriate $V'_{oc}$ point for a given operating point (e.g., $V_0$ and $I_0$ at $E_0$):

$$I_0 = I_{sc,0}\left(1 - \frac{E'}{E_0}\right) \quad (2)$$

where $I_{sc,0}$ is the measured or estimated short-circuit current value at irradiance $E_0$. The left hand side of Equation (2) is simply the current of the operating point (e.g., point 2). To seek the point on the series-resistance-free IV curve that has that same current, the current term from Equation (1) has been taken for the right hand side of Equation (2).

Solving Equation (2) for E' provides an expression for the target irradiance value $E'_{target}$, the irradiance from which the $V'_{oc}$ can be sought:

$$E'_{target} = E_0\left(1 - \frac{I_0}{I_{sc,0}}\right) \quad (3)$$

In some examples, $E_0$ may be obtained using a reference PV device or using an irradiance sensor (e.g., a pyranometer) that directly measures irradiance. In some examples, $E_0$ may be estimated based on a comparison of a reference short-circuit current value to the present short-circuit current value. This estimation may be referred to as a "self-irradiance," in that the irradiance estimate may be calculated by comparing the present short-circuit current value of the PV device to another short-circuit current value of the PV device, instead of measuring the irradiance using a reference PV device or irradiance sensor. In some examples, such as those in which RTSR is being used to determine series resistance of one or more PV devices of a PV power plant, an irradiance estimate may be calculated by comparing the present operating current value of at least a portion of the PV power plant to an expected operating current value (e.g., a maximum rated current value, a measured maximum current value, a recent measured maximum current value, etc.) of the at least a portion of the PV power plant. In other words, irradiance may, in various examples, be estimated by treating a reference short-circuit current value or operating current value as an indicator of maximum irradiance, and then estimating the present irradiance value as a percentage or fraction thereof.

Based on the target irradiance value $E_{target}$, the open-circuit voltage value $V'_{oc}$ of the PV device at $E_{target}$, as defined by point 4, can be determined. Various methods for determining $V'_{oc}$ at $E_{target}$ may be used in accordance with the techniques described herein. One example method is further described with respect to FIG. 4 below.

Based on $V_0$, $I_0$, and $V_{oc}$ at $E_{target}$, a series resistance value $R_s$ of the PV device can be determined. For instance, the point (e.g., point 6) on the series-resistance-free IV curve that corresponds to the operating irradiance value $E_0$ may be determined. The current value for point 6 is taken to be the current value of point 2, and the voltage value for point 6 is taken to be the voltage value of point 4. The series resistance value $R_s$ may then be calculated from the difference between $V'_{oc}$ and $V_0$ (shown as $\Delta V$ in FIG. 1) and $I_0$ using Ohm's law. That is, $R_s$ equals $\Delta V$ divided by $I_0$. Equation (2) defines the length of the dashed vertical line shown in FIG. 1, which can be considered the translation of point 4 to the series-resistance-free IV curve. The horizontal difference between the real operating point and the hypothetical series-resistance-free operating point represents the ohmic voltage loss due to series resistance.

In some examples, RTSR may include leveraging the temperatures and irradiances of a device to further simplify the series resistance monitoring. For instance, $I_0$ may be estimated using the operating irradiance value $E_0$ as described herein. As another example, RTSR may utilize temperature and/or irradiance to accurately estimate the open-circuit voltage value $V'_{oc}$, as described with respect to FIG. 4 below.

Figure 2:
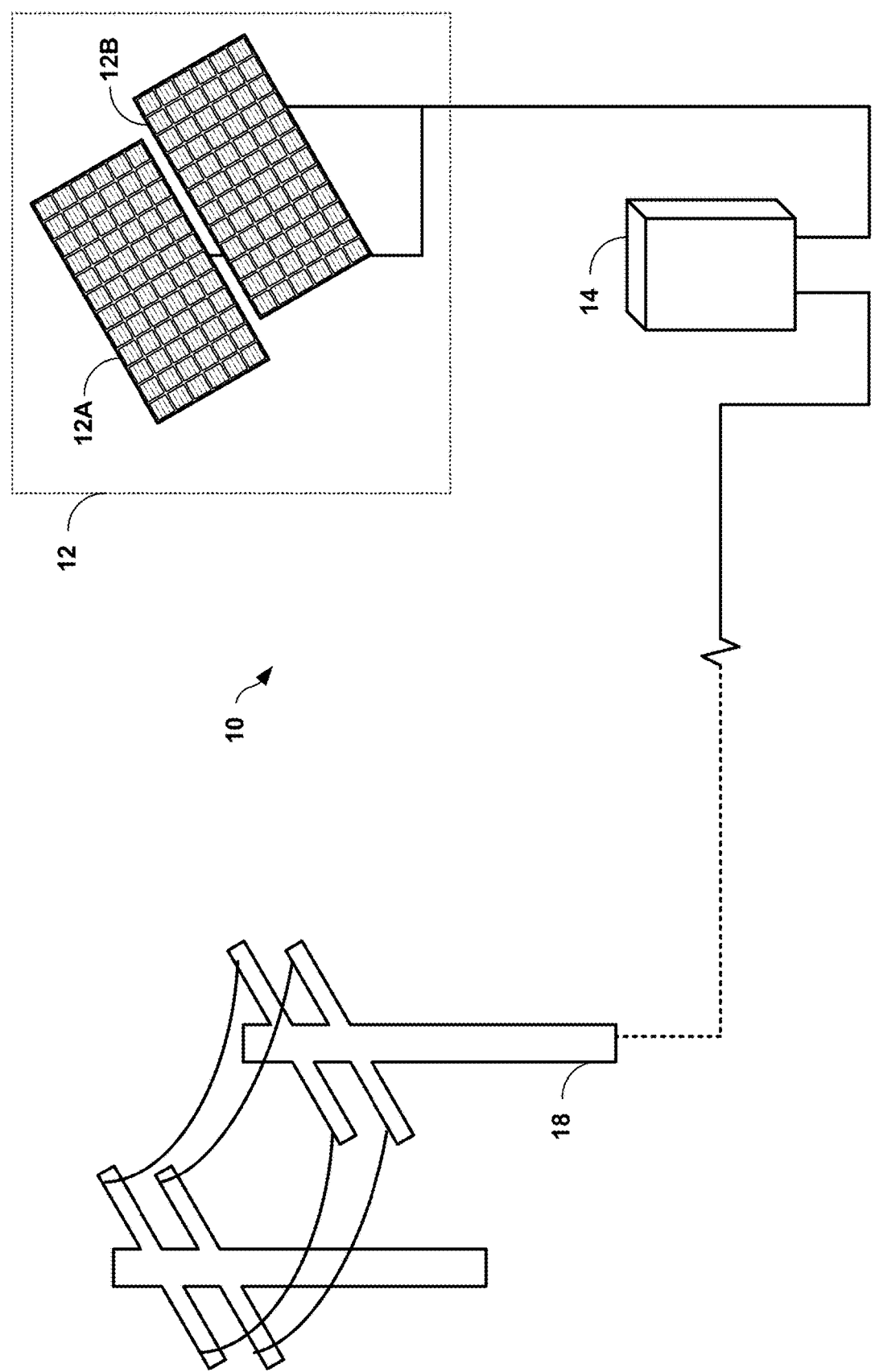
FIG. 2 is a conceptual diagram illustrating an example system that is configured to monitor the series resistance of a PV device, in accordance with one or more aspects of the present disclosure.

FIG. 2 is a conceptual diagram illustrating an example system (e.g., system 10) that is configured to monitor the series resistance of a PV device, in accordance with one or more aspects of the present disclosure. The configuration of system 10 represents only one example configuration, and various other configurations may be used in other examples. In the example of FIG. 2, system 10 includes PV devices 12A and 12B (collectively "PV devices 12") and inverter 14. In some examples, system 10 may include more components, fewer components, or different components than those shown in FIG. 2. For instance, system 10 may represent a PV power plant system, including hundreds or thousands of PV panels and numerous inverters, as well as various PV control systems, power conditioning systems, etc. As another example, system 10 may represent a home PV system, and include a fuse box, a battery, and/or other components.

In the example of FIG. 2, PV devices 12 are configured to convert light energy into electrical energy. PV devices 12 may represent any type of PV device that may benefit from series resistance monitoring as described herein. For instance, PV devices 12 may be silicon devices, copper indium gallium selenide (CIGS) devices, cadmium telluride devices, perovskite devices, organic devices, or any other PV device. Each of PV devices 12 may, in various examples, represent any photovoltaic device, such as one or more PV modules, one or more PV cells, one or more PV strings, one or more PV panels, etc. Furthermore, each of PV devices 12 and may, in some examples, include various electrical connections, interconnections, and/or other components.

As shown in the example of FIG. 2, PV devices 12 are connected to inverter 14. PV devices 12 may receive light (e.g., sunlight) and generate variable direct current (DC) electrical power. Thus, when deployed for operation as part of system 10, PV devices 12 may create a voltage differential and output electrical current. This variable DC electrical power may be transmitted to inverter 14.

Inverter 14, as shown in the example of FIG. 2, may be configured to receive the variable DC electrical power from PV devices 12, and convert the variable DC electrical power into alternating current (AC) electrical power. Inverter 14 may then output the AC electrical power for various uses. As shown in the example of FIG. 2, for instance, the AC electrical power may be fed into commercial electrical grid 18. In some examples, the AC electrical power may additionally or alternatively be used by a local electrical network and/or by specific electrical devices.

In accordance with the techniques of the present disclosure, inverter 14 may also be configured to monitor the series resistance value $R_s$ of one or more of PV devices 12 (e.g., including any number of components) using RTSR as described herein. That is, inverter 14 may periodically determine (e.g., receive, measure, etc.) various operating values and low-irradiance values, and determine the series resistance value $R_s$ of PV devices 12. For instance, inverter 14 may determine the series resistance value $R_s$ every 10 ms, every 100 ms, every second, every 10 seconds, every minute, or at any other suitable frequency.

In some examples, inverter 14 may use RTSR to determine the individual series resistance value $R_s$ of each of PV devices 12. For instance, inverter 14 may be individually connected to each of PV devices 12, and may measure the individual operating values of each PV device for use in respective RTSR calculations. In some examples, such as when PV devices 12 are linked or otherwise not individually connected to inverter 14, inverter 14 may use RTSR to determine the collective series resistance value $R_s$ of PV devices 12. In some examples in which additional components (e.g., electrical connections, solder joints, and/or other components) are included in system 10, inverter 14 may use RTSR to determine a series resistance value $R_s$ of some portion of system 10. In other words, the series resistance monitoring using RTSR may be performed with varying levels of granularity in different examples, according to what each system may be set up to allow.

In some examples, inverter 14 may compare a determined series resistance value $R_s$ to a threshold value. Based on the comparison, inverter 14 may modify the operation of system 10 in some way. For instance, the threshold value may represent a point at which operation of system 10 becomes unsafe (i.e., a threshold safety value). If the series resistance value $R_s$ exceeds the threshold safety value, inverter 14 may electrically disconnect one or more of PV devices 12 from one or more other components of system 10. That is, inverter 14 may cause at least a part of the electricity generation portion of system 10 to cease generating electricity.

In some examples, inverter 14 may perform operations based on the determined series resistance value $R_s$ itself. For instance, inverter 14 may output an indication of the series resistance value $R_s$ to one or more other devices, such as to a control system of commercial electrical grid 18, to a device of a manager or operator of system 10, and/or to one or more components of system 10. As another specific example, based on the determined series resistance value $R_s$, inverter 14 may output an alarm, a warning, an alert, or other message to one or more other components of system 10, to one or more components of commercial electrical grid 18, and/or to one or more devices of a manager or operator of system 10. For instance, the message may indicate that system 10 needs maintenance, that the determined series resistance value $R_s$ deviates in some way from an expected value or previous value(s), and/or other information. In general, real-time series resistance information may be used for various purposes, and inverter 14 may perform any number of actions to accomplish such purposes.

While described in the example of FIG. 2 as being performed by inverter 14, the RTSR method described herein may, in various examples, be performed by any capable components within system 10. For instance, the techniques described herein may be performed by one or more processors embedded in PV devices 12, by a combiner box, by a micro-inverter, by a DC power optimizer, by a central inverter, by a fuse box, a battery or battery controller, a charge controller, a generation meter, an electricity meter, a tracking system, a DC or AC isolator, by one or more dedicated real-time series resistance monitoring components, or by any other components. Further details of a device configured to perform the techniques described herein are described with respect to FIGS. 3 and 4, below.

Figure 3:
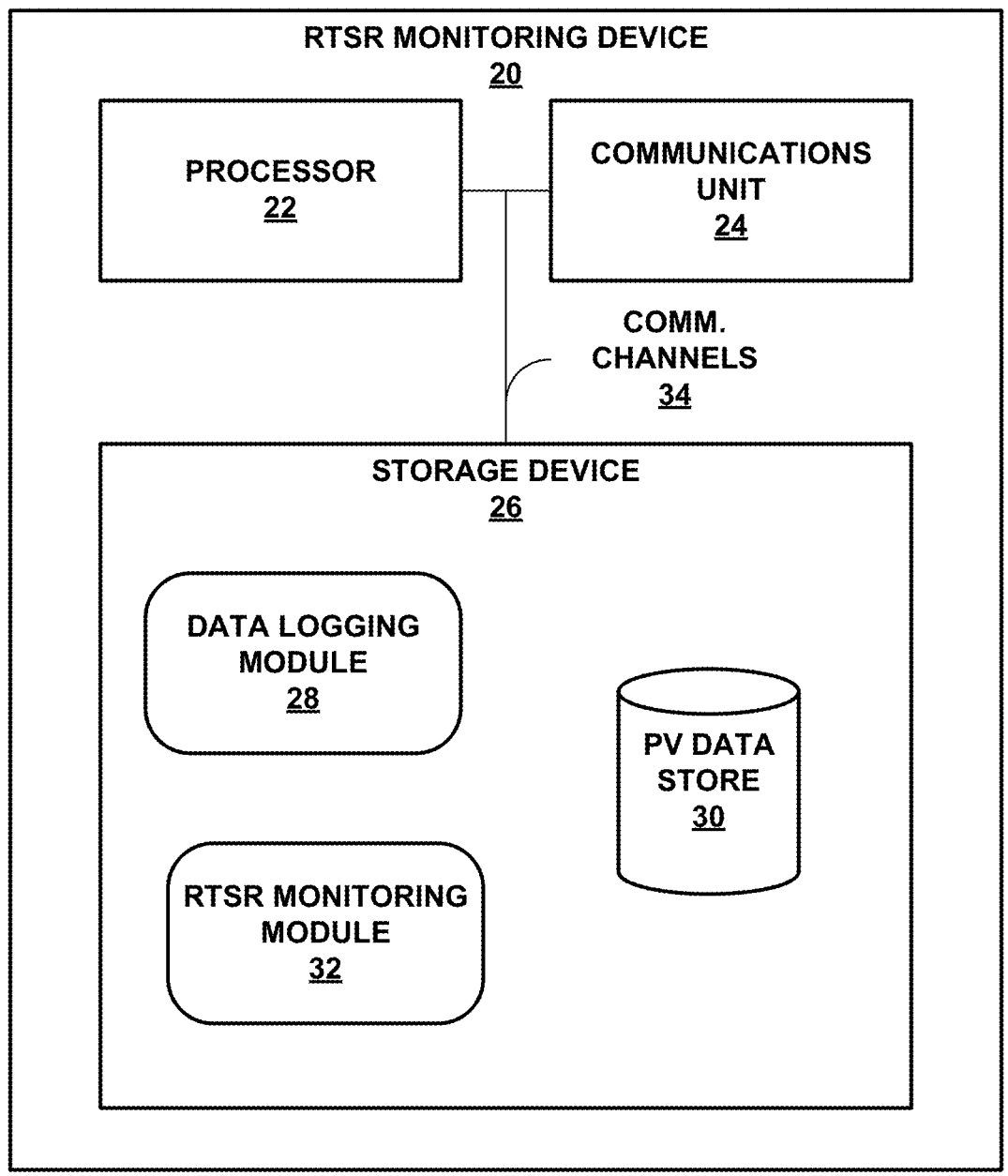
FIG. 3 is a block diagram illustrating an example device that is configured to monitor the series resistance of a PV device, in accordance with one or more aspects of the present disclosure.

FIG. 3 is a block diagram illustrating an example device (e.g., RTSR monitoring device 20) that is configured to monitor the series resistance of a PV device, in accordance with one or more aspects of the present disclosure. FIG. 3 illustrates only one particular example of a device configured to implement the techniques described herein, and various other devices may be used in other examples.

In the example of FIG. 3, RTSR monitoring device 20 may represent a standalone device that may be included in a PV system (e.g., between PV device(s) and an inverter, or at another location within the PV system) to monitor series resistance of one or more components within the PV system. In other examples, RTSR monitoring device 20 may represent a version of an existing component in a PV system, such as an inverter, a PV device itself, a fuse box, a battery or battery controller, a charge controller, a generation meter, an electricity meter, a tracking system, a DC or AC isolator, or another component. In other words, while not shown, RTSR monitoring device 20 may, in some examples, include additional components and/or be configured to perform additional operations unrelated to the present disclosure.

As shown in the example of FIG. 3, RTSR monitoring device 20 includes processor 22, communications unit 24, and storage device 26. Storage device 26 further includes data logging module 28, PV data store 30, and RTSR monitoring module 32. Each of components 22, 24, and 26 may be interconnected (physically, communicatively, and/or operatively) for inter-component communications. In the example of FIG. 3, components 22, 24, and 26 may be coupled by one or more communications channels (e.g., comm. channels 34). In some examples, communications channels 34 may include a system bus, a network connection, an inter-process communication data structure, or any other channel for communicating data. Modules 28 and 32, as well as PV data store 30 may also communicate information with one another, as well as with other components in RTSR monitoring device 20.

In some examples, RTSR monitoring device 20 may include more, fewer, or different components than those shown in FIG. 3. For instance, in some examples RTSR monitoring device 20 may include one or more input devices, one or more output devices, one or more sensors, and/or other devices.

In the example of FIG. 3, communications unit 24 is operable to communicate with external sources via one or more networks by transmitting and/or receiving network signals on the one or more networks. For example, RTSR monitoring device 20 may use communications unit 24 to transmit and/or receive information about the voltage and/or current of one or more PV devices (e.g., which may or may not include other components such as solder joints, electrical connections, and others). As another example, RTSR monitoring device 20 may use communications unit 24 to transmit and/or receive information from one or more sensors, such as an irradiance sensor, a temperature sensor, or another sensor that takes measurements of PV device operating parameters. Examples of communications unit 24 include a network interface card (e.g., such as an Ethernet card), an optical transceiver, a radio frequency transceiver, a communications bus of a microcontroller or other processor, a port (e.g., such as for a serial connection), or any other mechanism that can be used to send and/or receive information. Other examples of communications unit 24 may include short wave radios, cellular data radios, wireless network (e.g., Wi-Fi®) radios, and universal serial bus (USB) controllers. While referenced herein as a single communications unit, communications unit 24 may, in various examples, represent any number of communications units operable of communicating in the same or different ways.

Storage device 26, in the example of FIG. 3, is operable to store information for processing during operation of RTSR monitoring device 20. In some examples, storage device 26 may represent a temporary memory, meaning that a primary purpose of storage device 26 is not long-term storage. For instance, storage device 26 may be volatile memory, configured for short-term storage of information, and therefore storage device 26 may not retain stored contents if powered off. Examples of volatile memories include random access memories (RAM), dynamic random access memories (DRAM), static random access memories (SRAM), and other forms of volatile memories.

Storage device 26, in some examples, may also represent a computer-readable storage medium. That is, storage device 26 may be configured to store larger amounts of information and/or for longer periods of time. For instance, storage device 26 may include non-volatile memory that retains information through power on/off cycles. Examples of non-volatile memory include magnetic hard discs, optical discs, floppy discs, flash memories, forms of electrically programmable memories (EPROM) or electrically erasable and programmable memories (EEPROM), and others.

While referenced herein as a single storage device, storage device 26 may, in various examples, represent any number of storage devices. For instance, in some examples RTSR monitoring device 20 may include a plurality of storage devices, at least one being temporary memory and at least one being long-term storage. In any case, storage device 26 may, in the example of FIG. 3, store program instructions and/or data associated with modules 28 and 32 and/or PV data store 30.

In the example of FIG. 3, processor 22 is configured to implement functionality and/or execute instructions within RTSR monitoring device 20. For example, processor 22 may be operable to receive and execute instructions stored at storage device 26 that implement the functionality of data logging module 28, PV data store 30, and/or RTSR monitoring module 32. These instructions, when executed by processor 22, may cause RTSR monitoring device 20 to store information within storage device 26 (e.g., in temporary memory) during execution. While referenced herein as a single processor, processor 22 may, in various examples, represent one or more processors configured to execute instructions in a parallelized fashion.

Data logging module 28, in the example of FIG. 3, may be executable (e.g., by processor 22) to receive data, store the data in PV data store 30, and/or manage data stored in PV data store 30. For instance, data logging module 28 may periodically receive sensor data and/or other data regarding the operation of a PV system from communications unit 24. Data logging module 28 may access PV data store 30 to store the received data.

In some examples, data logging module 28 may modify or add to the data before storage in PV data store 30. As one example, data logging module 28 may be operable to translate raw sensor data into more relevant units, such as degrees, volts, amps, etc. As another example, data logging module 28 may be operable to average received data in some way. For instance, data logging module 28 may receive information from a temperature sensor every 50 ms and average every 3 (or 5, or other number) readings to obtain more accurate temperature information. As yet another example, data logging module 28 may be operable to create associations between various received data and/or append timestamp information to data before storing the modified and/or appended data in PV data store 30.

In some examples, data logging module 28 may manage data stored in PV data store 30. For example, data logging module 28 may be operable to only maintain data for a specified period of time. Thus, data logging module 28 may determine when data should no longer be maintained (e.g., using a timestamp with which the data may be associated) and discard or overwrite the data.

In the example of FIG. 3, PV data store 30 stores data about the operation of a PV system that may be used to determine series resistance information. PV data store 30 may be any suitable data structure, such as a database, a table, an array or array of arrays, a linked list, a group of registers, or any other structure usable to store data for use by processor 22 in determining series resistance of a portion of a PV system. PV data store 30 may be accessible by one or more other components of RTSR monitoring device 20, such as data logging module 28 and/or RTSR monitoring module 32.

RTSR monitoring module 32, in the example of FIG. 3, may be executable to determine the series resistance value $R_s$ of at least a portion of a PV system as detailed herein. For instance, RTSR monitoring module 32 may determine a target irradiance value $E_{target}$ based on an operating current value, a short-circuit current value (e.g., measured or estimated), and an operating irradiance value $E_0$. RTSR module may also determine an open-circuit voltage value $V_{oc}'$ at the target irradiance value $E_{target}$, and determine a series resistance value $R_s$ based on an operating voltage value, the operating current value, and the open-circuit voltage value $V_{oc}'$ at the target irradiance value $E_{target}$ RTSR monitoring module 32 may, in some examples, perform one or more actions based on the determined series resistance value $R_s$.

In the example of FIG. 3, data logging module 28 may collect data during regular operation of a PV system. For instance, one or more components of RTSR monitoring device 20 may periodically request (e.g., via communications unit 24) information from one or more sensors associated with a PV device. As another example, RTSR monitoring device 20 may collect the data by measurement of values, such as by measuring a current value for the PV device, a voltage value for the PV device, a short-circuit current value for the PV device, an open-circuit voltage value for the PV device, or other value.

In response to a request by data logging module 28 and/or at the instruction of data logging module 28, communications unit 24 may receive or obtain an indication of a temperature value and an irradiance value for the PV device. For instance, the indication of the temperature value may be data received from a temperature sensor near or attached to the PV device. The indication of the irradiance value may be actual data received from an irradiance sensor, actual data received from a reference PV device, and/or estimated data determined based on a received short-circuit current value of the PV device. Communications unit 24 may communicate the information to one or more other components within RTSR monitoring device 20, such as data logging module 28 and/or RTSR monitoring module 32.

In some examples, data logging module 28 may compare the irradiance value to a threshold irradiance value (e.g., 200 W/m$^2$). If the irradiance value is above the threshold value, data logging module 28 may determine (e.g., receive, measure, etc.) an operating voltage value and an operating current value for the PV device. Data logging module 28 may send the information (e.g., the temperature, the irradiance, the operating voltage value and the operating current value) to RTSR monitoring module 32 for calculation of series resistance, as further described below. In some examples, data logging module 28 may additionally or alternatively store the information in PV data store 30 (e.g., as part of an "operational dataset").

If the received irradiance value is below the threshold value, data logging module 28 may determine (e.g., receive, measure, etc.) an open-circuit voltage value $V_{oc}'$ for the PV device. For instance, data logging module 28 may cause one or more components in the PV system to disconnect the PV device from any loads, may determine (e.g., receive, measure, etc.) the open-circuit voltage value $V_{oc}'$, and may cause the one or more components to reconnect the PV device. Data logging module 28 may store the temperature, irradiance, and open-circuit voltage values in PV data store 30 (e.g., as part of a "low-irradiance $V_{oc}$ dataset").

In some examples, data logging module 28 may determine (e.g., receive, measure, etc.) both the operating voltage value and current value and the open-circuit voltage value $V_{oc}'$ regardless of the irradiance. That is, in some examples RTSR monitoring device 20 may determine when it should collect low-irradiance measurements and when it should collect operational measurements while in other examples, RTSR monitoring device 20 may collect all data (e.g., temperature, irradiance, operating voltage value, operating current value, and open-circuit voltage value $V_{oc}'$) each measurement time.

The following are examples of how RTSR monitoring device 20 may determine (e.g., receive, measure, etc.) the necessary measurements to determine series resistance:

1) RTSR monitoring device 20 directly measures the operating current value and voltage value of the PV device; RTSR monitoring device 20 communicates with a PV system inverter, and the inverter momentarily allows RTSR monitoring device 20 to measure the open-circuit voltage value $V_{oc}'$ of the PV device; RTSR monitoring device 20 directly communicates with the inverter, and the inverter momentarily allows RTSR monitoring device 20 to measure the short-circuit current value of the PV device; RTSR monitoring device 20 obtains PV device temperature from a temperature sensor.

2) RTSR monitoring device 20 directly measures the operating current value and voltage value of the PV device; RTSR monitoring device 20 manipulates the inverter side of the PV system to prevent inverter from tripping off while momentarily measuring the open-circuit voltage value $V'_{oc}$ of the PV device; RTSR monitoring device 20 manipulates the inverter side of the PV system to prevent inverter from tripping off while momentarily measuring the short-circuit current value of the PV device; RTSR monitoring device 20 obtains PV device temperature from a temperature sensor.

3) RTSR monitoring device 20 directly measures the operating current value and voltage value of the PV device; RTSR monitoring device 20 detects when the inverter is off (e.g., in low light conditions) and measures the open-circuit voltage value $V'_{oc}$ of the PV device while the inverter is off; RTSR monitoring device 20 manipulates the inverter side of the PV system to prevent inverter from tripping off while momentarily measuring the short-circuit current value of the PV device; RTSR monitoring device 20 obtains PV device temperature from a temperature sensor.

In any of the above examples, RTSR monitoring device 20 may, in some instances, not measure the short-circuit current value for use in estimating irradiance, but instead measure irradiance itself (e.g., using one or more irradiance sensors and/or using an external data source, such as irradiance modeled from satellite data). Furthermore, in some instances, RTSR monitoring device 20 may not obtain the actual PV device temperature, but instead use a model of the PV device temperature and a measurement of ambient temperature, or ambient temperature data from another source. Data logging module 28 may store determined data in PV data store 30.

As described, the operational dataset may include the current and voltage values of the PV device under operating load, along with irradiance and temperature values: (V, I, E, T). The low-irradiance $V_{oc}$ dataset (in some examples collected at irradiances below a certain threshold) may include $(V_{oc}, E', T')$ points. Determining $V_{oc}$ only when the measured irradiance is below a certain threshold may ensure that the PV device is not disconnected during high-irradiance times (e.g., during the day) when the PV device may generate substantial power. Instead, $V_{oc}$ may only be measured during low-irradiance times (e.g., at night, during cloud cover, etc.) when momentary disconnection of the PV device may not substantially affect power generation.

RTSR monitoring module 32 may use the operational dataset and the low-irradiance $V_{oc}$ dataset to determine the series resistance value $R_s$ of the PV device. As one example process for finding the series resistance value $R_s$ of a given operational point $(V_0, I_0, E_0, T_0)$, RTSR monitoring module 32 may perform the following operations:

1) Calculate the target irradiance value, $E_{target}$, according to Equation (3).
2) Select a subset of $(V'_{oc}, E', T')$ points that were measured over the course of the preceding time period of length 1 and that are within threshold d of $E_{target}$. For instance, an l of one week and a d of ±10% may be used.
3) Using the subset of $(V'_{oc}, E', T')$ identified in Operation 2, generate and fit a model for $V'_{oc}$ as a function of operating conditions, such as E' and T'. For instance, a linear regression may be performed to fit $V'_{oc}$ vs. T'.
4) Use the value of the regression at $T_0$ to calculate the expected value of $V'_{oc}$ at temperature $T_0$, denoted $V_{oc}(T_0)$. Operations 2-4 are further described with respect to FIG. 4, below.
5) Calculate the series resistance value $R_s$ associated with the operational point $(V_0, I_0, E_0, T_0)$ using:

$$R_s = \frac{V'_{oc}(T) - V_0}{I_o} \quad (4)$$

In practice, RTSR monitoring module 32 may calculate the series resistance value $R_s$ in real time or near real time as $(V_0, I_0, E_0, T_0)$ data points are received by RTSR monitoring device 20. After determining the series resistance value $R_s$, RTSR monitoring module 32 may perform one or more actions based on the determined series resistance value $R_s$. For example, RTSR monitoring module 32 may compare the series resistance value $R_s$ to a threshold safety value. If the series resistance value $R_s$ exceeds the threshold safety value, RTSR monitoring module 32 (e.g., via communications unit 24) may cause one or more components of the PV system to disconnect the PV device in order to prevent overheating and/or avoid a fire hazard.

As another example, based on the determined series resistance value $R_s$, RTSR monitoring module 32 may modify the operation of one or more components in the PV system itself. For instance, RTSR monitoring module 32 may adjust the operation of the PV device, such as causing the PV device to operate at a different current and/or a different voltage value. As one specific example, RTSR monitoring module 32 may cause one or more components of the PV system to impose a current limit on the PV device. As another example RTSR monitoring module 32 may cause one or more components of the PV system (e.g., an inverter or controller) to move to a different operating point on the current-voltage curve. As yet another example, RTSR monitoring module 32 may actively move the operating point of the PV device to a different point on the current-voltage curve (e.g., with the use of DC-DC conversion). In some examples, operating a PV device at a lower current and higher voltage may reduce loss due to an increased series resistance.

As yet another example, RTSR monitoring module 32 may output (e.g., via communication module 24) an indication of the series resistance value $R_s$ to one or more other devices, such as one or more components of the PV system, one or more devices of an operator or manager of the PV system, one or more components of an associated electrical grid, or other devices.

In some examples, RTSR monitoring module 32 may compare the series resistance value $R_s$ to a threshold operating value that specifies an acceptable level of series resistance in the PV device. If the series resistance value $R_s$ exceeds the threshold operating value, RTSR monitoring module 32 (e.g., via communications unit 24) may output an alarm, warning, or notification to one or more other devices, such as to a device of a manager or operator of the PV system, to one or more components of the PV system (e.g., a PV system inverter, a PV system controller, etc.), one or more components of an associated electrical grid, or other devices. In some examples, RTSR monitoring module 32 may compare a current series resistance value $R_s$ to one or more previous series resistance values. That is, RTSR monitoring module 32 may maintain at least one previous series resistance value $R_s$ (e.g., by storing the at least one previous series resistance value in PV data store 30) and may compare the most recently determined series resistance value $R_s$ to the at least one previous series resistance value. If RTSR monitoring module 32 detects a substantial change over a specified time period, RTSR monitoring module 32 may perform any of the various actions described herein, such as shutting down the entire PV system, disconnecting the PV device, modifying operation of one or more components of the PV system (e.g., including adjusting operation of the PV device itself as described above), outputting an alarm signal to other components of the PV system, and/or outputting alarms, warnings, alerts, or other indications.

While data logging module 28 may measure and store numerous values of irradiance, temperature, and open-circuit voltage value $V'_{oc}$ as part of the low-irradiance $V_{oc}$ dataset, it is possible that PV data store 30 may not include data that corresponds exactly to the determined target irradiance value $E_{target}$. RTSR monitoring module 32 may estimate the open-circuit voltage value $V'_{oc}$ based on open-circuit voltage values that correspond to irradiances similar to the target irradiance value $E_{target}$. Furthermore, because the temperature of the relevant $V'_{oc}$ points, taken at low-irradiance, is typically lower than that under high-irradiance operating conditions, RTSR monitoring module 32 may, in some examples, account for the temperature difference by regressing $V'_{oc}$ vs. T' to the temperature of the PV device at the operating point under consideration.

Figure 4:
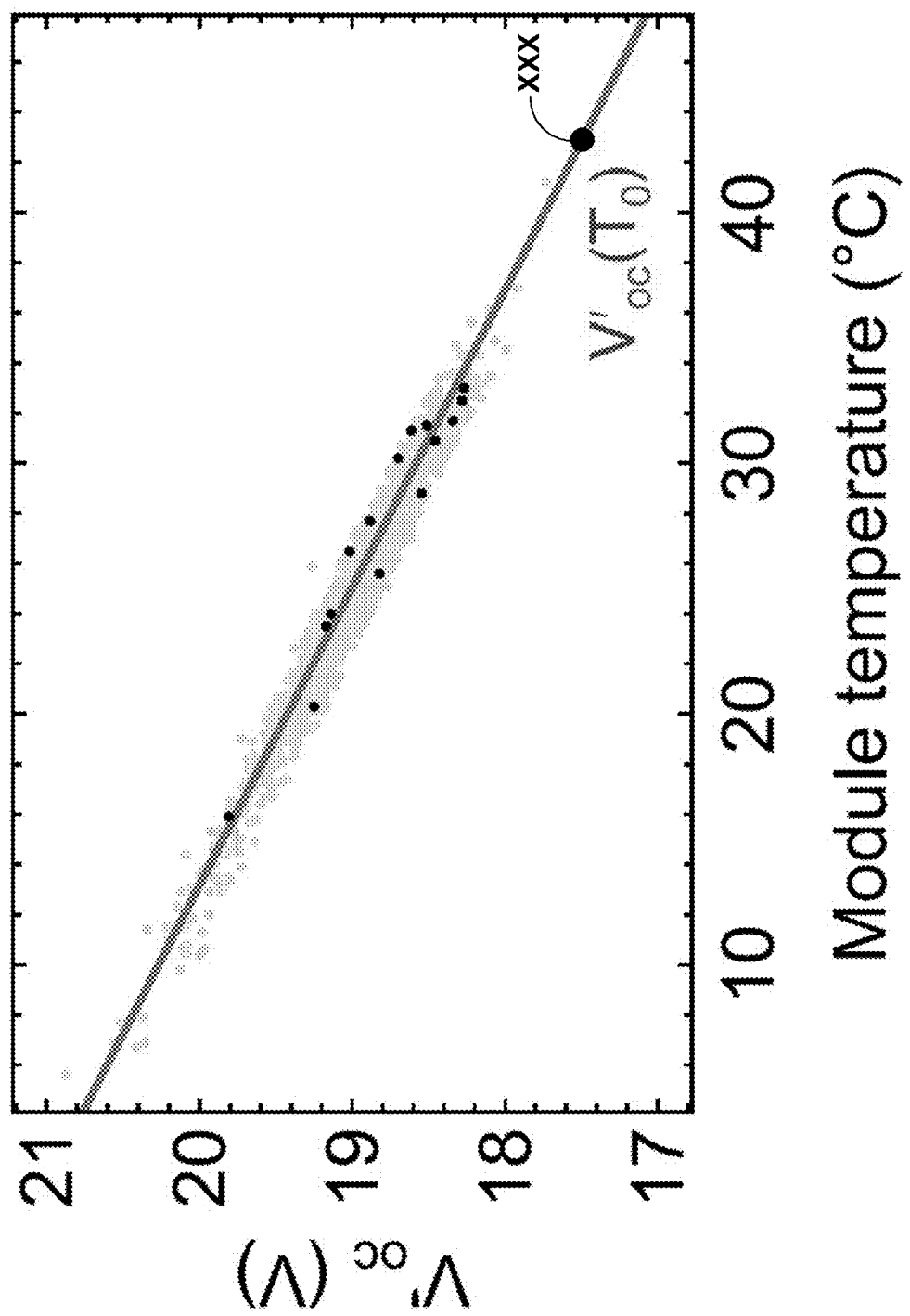
FIG. 4 is a graphical plot illustrating one example of a regression analysis that may be used to determine the series resistance of a PV device, in accordance with one or more aspects of the present disclosure.

FIG. 4 is a graphical plot illustrating one example of a regression analysis that may be used to determine the series resistance of a PV device, in accordance with one or more aspects of the present disclosure. The example of FIG. 4 is described below within the context of RTSR monitoring device 20 as shown in FIG. 3. The plot shown in FIG. 4 represents a visual example of operations that may be performed by RTSR monitoring module 32 on a silicon PV module to determine an open-circuit voltage value $V'_{oc}$ of the module at the target irradiance value $E_{target}$. Regressing in situ data near the irradiance of interest (i.e., the target irradiance value $E_{target}$) may eliminate complications associated with the irradiance dependence of the $V_{oc}$ temperature coefficient.

RTSR monitoring module 32 may filter the entire low-irradiance $V_{oc}$ dataset to obtain only those data points that have an irradiance value within a threshold of the target irradiance value $E_{target}$. The threshold may be a percentage value (e.g., 5%, 10%, 15%, etc.), a numeric value (e.g., 0.001, 0.05, 0.2, etc.) or other value. For instance, the light gray points in FIG. 4 may represent all the points which have an irradiance within 10% of the target irradiance value $E_{target}$ (e.g., d=10%). RTSR monitoring module 32 may also filter the data to find only those points in recent history (e.g., within a time period l). This further filtered data is shown as black points in FIG. 4. l may be any useful period of time, such as 1 day, 2 days, 1 week, 1 month, or another time period. Filtering the low-irradiance $V_{oc}$ data to limit it to a certain recent time period may ensure that any potential PV device changes (e.g., changing the shunt resistance) and/or PV system changes are taken into account when estimating the open-circuit voltage value $V'_{oc}$.

In order to reduce scatter in the series resistance values, a relatively small sample of ($V'_{oc}$, T') points should be used. Furthermore frequent evaluation of the fit as an extrapolation may also be beneficial. The frequency of $V'_{oc}$ sampling, along with l and d, can all be adjusted to optimize the response time and uncertainty of the method for a given application. Using a short time for l allows RTSR monitoring module 32 to quickly adapt to other changes in the IV characteristic. This may be balanced with a tradeoff in the number of points available for regression of $V'_{oc}$ vs. T'.

While described in the example of FIG. 4 as a regression of $V'_{oc}$ vs. T', RTSR monitoring module 32 may, in other examples, model $V'_{oc}$ vs. E' or $V'_{oc}$ vs. T' and E'. That is, the open-circuit voltage value $V'_{oc}$ at the target irradiance value $E_{target}$ may be estimated based on open-circuit voltage values and their associated temperatures, on the open-circuit voltage values and their associated irradiances, or on the open-circuit voltage values and both their associated temperatures and associated irradiances.

Figure 5:
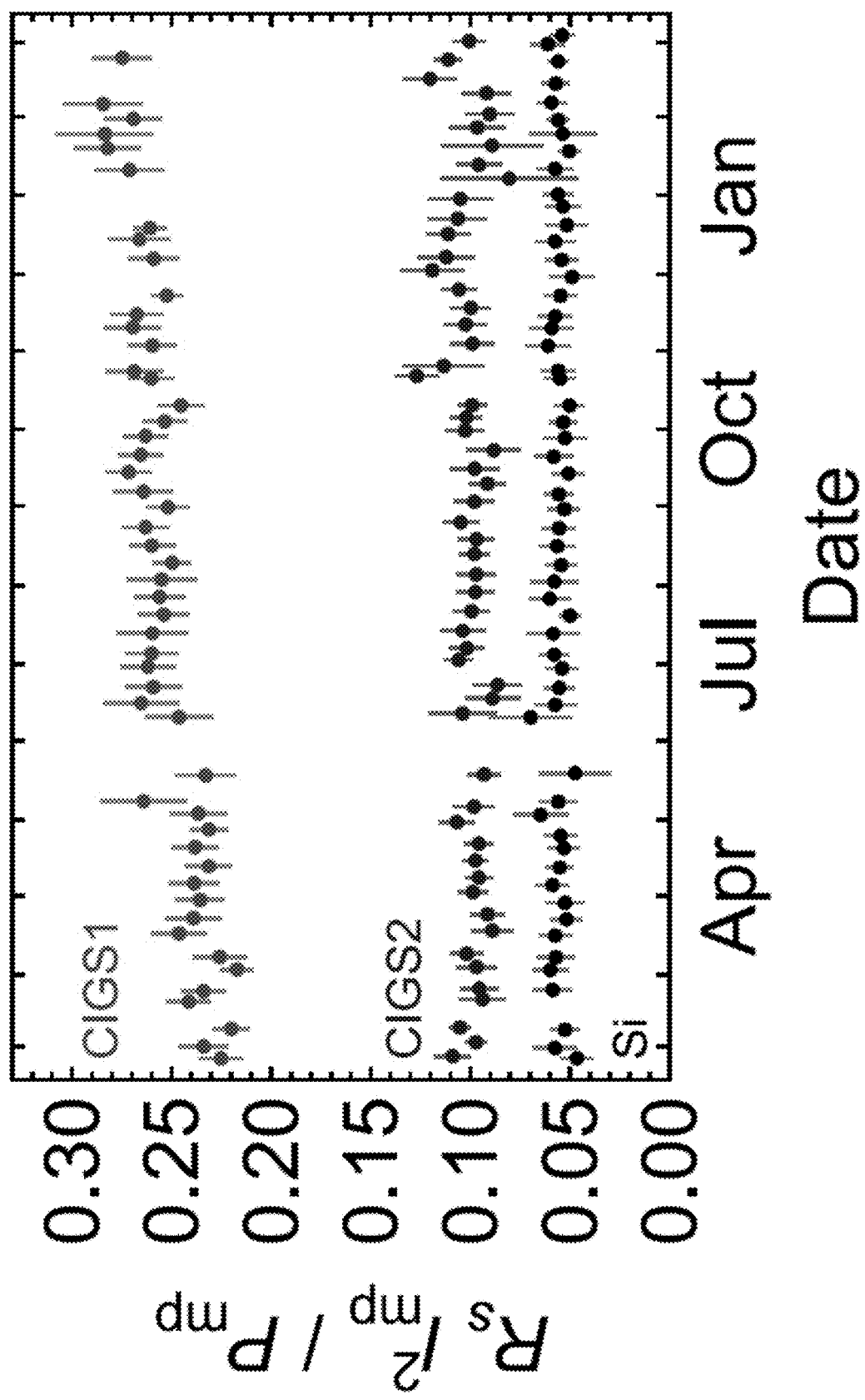
FIG. 5 is a graphical plot illustrating example mean fractional ohmic loss values determined for several PV modules, in accordance with one or more aspects of the present disclosure.

FIG. 5 is a graphical plot illustrating example mean fractional ohmic loss values determined for several PV modules, in accordance with one or more aspects of the present disclosure. In this example, the RTSR method was applied to a pre-existing publicly available set of outdoor PV module performance data (IV curves) from modules deployed in Cocoa, Fla. As previously explained, RTSR does not require full IV curves. However, this dataset was selected because it is publicly available and the IV curves enable validation of the RTSR method. In carrying out RTSR for this analysis, the $V_{oc}$ and operating point data were considered.

In the example of FIG. 5, an l of 1 week was used, meaning that for a given operating point, only the ($V'_{oc}$, E', T') points within the preceding week were used in the calculation of the series resistance value $R_s$. Also, a d of ±10% was used, and at least 10 ($V'_{oc}$, T') points were required to be available for regression. If this requirement was not met, no $R_s$ value was calculated for that operating point.

For irradiance, the self-irradiance calculated from $I_{sc}$ may be used, as opposed to measured irradiances from a thermopile pyranometer. In this way, the PV device may serve as its own irradiance sensor. In the example of FIG. 5, this decreased the uncertainty in the $R_s$ results by a factor of 3. The decrease in uncertainty may be attributed to the variation in the illumination spectrum between low- and high-irradiance periods, and also to differences in the angular response of a flat-plate solar panel and a pyranometer. Both of these factors become important in the RTSR analysis, which is based on the comparison of low- and high-irradiance periods. For example, near sunrise and sunset, where much of the low-irradiance data comes from, both the angle of incidence and the illumination spectrum vary substantially from mid-day. In the end-use case of RTSR, short-circuit current value measurements are not required; instead, a matched reference PV device may be used to provide better angular and spectral fidelity. Alternatively, matched reference PV devices may be used for the irradiance.

In the example of FIG. 5, three modules exhibited different behaviors over the course of the year-long data collection period: a Si module that did not substantially change in performance (sample mSi0188 in the public dataset), a first CIGS module (CIGS1 here, CIGS39017 in the dataset) which increased in series resistance, and a second CIGS module (CIGS2 here, CIGS8-001 in the dataset) which suffered a decrease in shunt resistance but no substantial change in series resistance. Although these data were analyzed after they had been collected, RTSR was applied to the operational points as if they were collected and processed in real time. The full IV curves in this dataset serve to validate the RTSR method described herein.

FIG. 5 shows the mean fractional standard test conditions (STC) ohmic loss, based on the calculated values for $R_s$ aggregated by week for the three modules. The fractional ohmic loss is calculated by $$L_\Omega = \frac{I_{mp}^2 R_s}{P_{mp}} \qquad (5)$$

where $I_{mp}$ and $P_{mp}$ are the nameplate values for current and power at STC maximum power. As shown in FIG. 5, RTSR is able to distinguish different fractional power losses for different modules. FIG. 5 also shows that RTSR detects changes in $R_s$ in the case of CIGS1, in contrast to CIGS2 and Si, which did not show increases in $R_s$.

Figure 6:
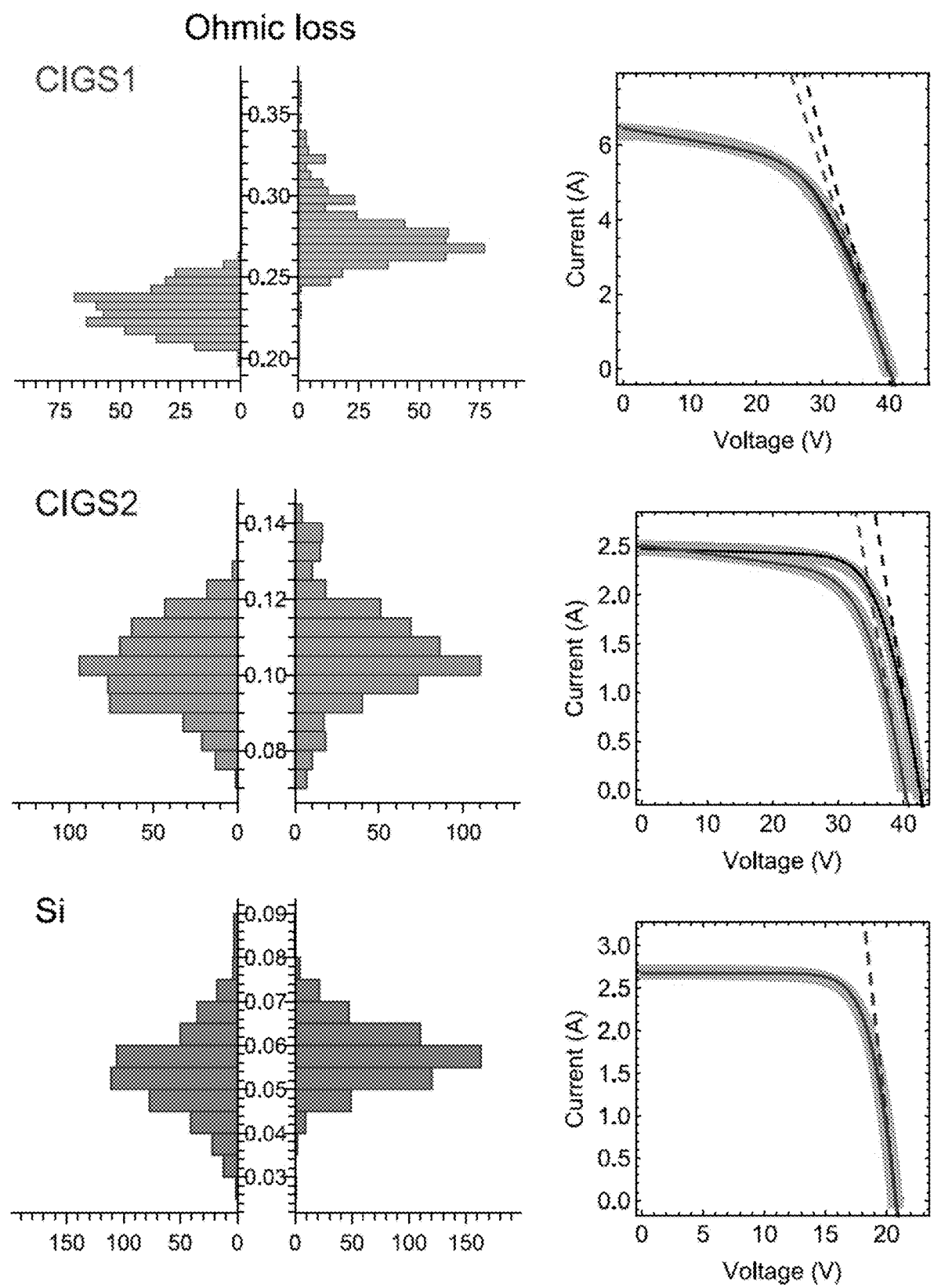
FIG. 6 is a series of graphical plots illustrating example ohmic loss and current-voltage (IV) curves for several PV modules, in accordance with one or more aspects of the present disclosure.

FIG. 6 is a series of graphical plots illustrating example ohmic loss and IV curves for several PV modules, in accordance with one or more aspects of the present disclosure. Specifically, FIG. 6 provides validation of the conclusions formed with respect to FIG. 5, with IV curves from the beginning and end of deployment taken under nearly identical temperature and irradiance conditions. For CIGS1, RTSR has indicated an increase in $R_s$ and thus the associated ohmic loss. This conclusion is supported by the decrease in slope of the IV characteristic near $V_{oc}$ exhibited for the curve collected near the end of deployment.

Another capability of the techniques described herein is ruling out an increased $R_s$ as a source of power loss. This is exemplified by the CIGS2 results shown in FIG. 6. The IV curves shown on the right indicate a substantial drop in power production for this module, likely caused by an increase in shunt resistance. Subsequent electroluminescence (EL) imaging of the module confirmed that the module had suffered severe shunting. However there is little to no apparent change in the series resistance, which agrees with the RTSR method.

Figure 7:
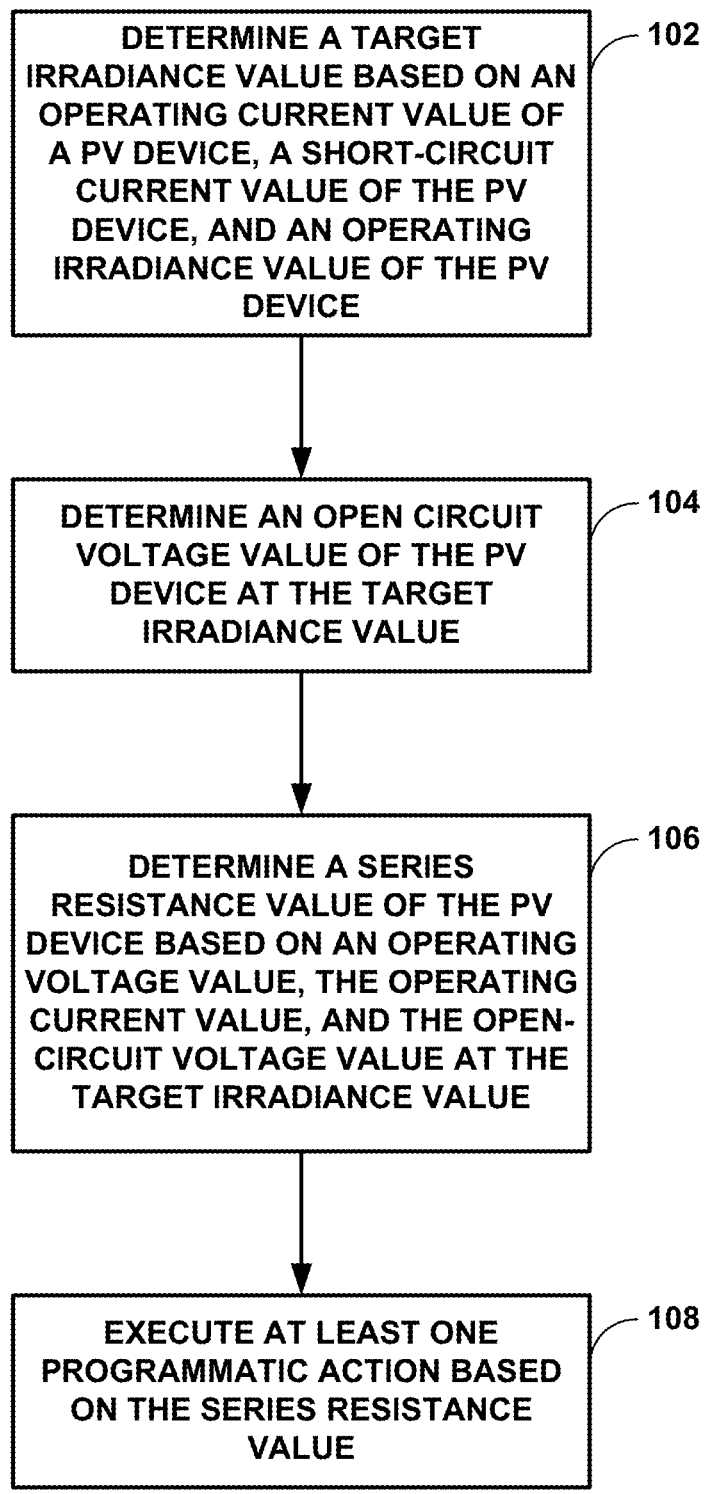
FIG. 7 is a flow diagram illustrating example operations for monitoring the series resistance of a PV device, in accordance with one or more aspects of the present disclosure.

FIG. 7 is a flow diagram illustrating example operations for monitoring the series resistance of a PV device, in accordance with one or more aspects of the present disclosure. For example purposes only, the operations of FIG. 7 are described below within the context of RTSR monitoring device 20 shown in FIG. 3. The operations shown in FIG. 7 represent only one set of operations for performing the techniques described herein, and additional or different operation may be included in other examples.

In the example of FIG. 7, RTSR monitoring device 20 may determine a target irradiance value $E_{target}$ based on an operating current value of a PV device, a short-circuit current value of the PV device, and an operating irradiance value of the PV device (102). For instance, processor 22 may receive indications of an operating current value, a short-circuit current value, and an operating irradiance value for a PV panel. Based on the operating current value, the short-circuit current value, and the irradiance value, processor 22 may determine the target irradiance value $E_{target}$ (e.g., using Equation (3)).

RTSR monitoring device 20, in the example of FIG. 7, may determine an open-circuit voltage value $V'_{oc}$ of the device at the target irradiance value $E_{target}$ (104). For instance, processor 22 may, in executing RTSR monitoring module 32, access PV data store 30 and select at least two measured open-circuit voltage values of the PV panel that are associated with respective irradiance values that are within a threshold distance from the target irradiance value $E_{target}$. Processor 22 may generate, based on the at least two open-circuit voltage values and respective temperature and/ or irradiance values with which the open-circuit voltage values are associated, a model of the PV panel that defines an open-circuit voltage value of the PV panel as a function of a temperature of the PV panel and/or an irradiance on the PV panel. Processor 22 may use the model on an operating temperature value of the PV panel and/or an operating irradiance value of the PV panel to determine the open-circuit voltage value $V'_{oc}$.

In the example of FIG. 7, RTSR monitoring device 20 may determine a series resistance value $R_s$ of the device based on an operating voltage value, the operating current value, and the open-circuit voltage value at the target irradiance value $E_{target}$ (106). For instance, processor 22 may, in executing RTSR monitoring module 32, determine a difference between the open-circuit voltage value $V'_{oc}$ measured at the target irradiance value $E_{target}$ and the operating voltage value and divide the difference by the operating current value to obtain the series resistance value $R_s$.

In the example of FIG. 7, RTSR monitoring device 20 may execute at least one programmatic action based on the series resistance value $R_s$ (108). For instance, processor 22 may, in executing RTSR monitoring module 32, compare the series resistance value $R_s$ to a threshold safety value. If the series resistance value $R_s$ exceeds the threshold safety value, processor 22 may cause the PV panel to be electrically disconnected (e.g., in order to avoid overheating or fire).

As another example, processor 22 may perform operations based on the determined series resistance value $R_s$ itself. For instance, processor 22 may output an indication of the series resistance value $R_s$ (e.g., to a device of an operator or manager of the PV system), send an alarm or warning signal to one or more other components of the PV system, and/or may modify operation of the PV panel based on the series resistance value $R_s$ (e.g., by imposing a current limit on the PV device, communicating to the inverter or controller to move to a different operating point on the current-voltage curve, or actively moving the operating point of the PV-device to a different point on the current-voltage curve, such as with the use of DC-DC conversion.). In yet further examples, processor 22 may compare the series resistance value $R_s$ to a threshold operating value and/or to one or more previously determined series resistance values. If the series resistance value $R_s$ exceeds the threshold operating value and/or substantially deviates from the one or more previously determined series resistance values, processor 22 may perform any of the possible operations described herein.

While full IV curves may be used for performing RTSR, the RTSR method described herein may provide improved speed of series resistance determination by not requiring the measurement any of the full IV curves of a device. This may allow for real-time or near real-time series resistance monitoring. Furthermore, the techniques described herein may be implemented using simple sensors and little processing power, avoiding the need for expensive components or custom-hardware. RTSR may also improve PV system safety and reliability, as series resistance can be a strong indicator of device condition, and increased series resistance or a sudden jump in series resistance can be a predictor of serious hardware problems.

The systems, techniques, and operations disclosed herein may be additionally or alternatively described by one or more of the following examples.

Example 1. A device comprising: at least one processor configured to: determine a target irradiance value based on an operating current value of a photovoltaic (PV) device, a short-circuit current value of the PV device, and an operating irradiance value of the PV device; determine an open-circuit voltage value of the PV device at the target irradiance value; determine a series resistance value of the PV device based on an operating voltage value of the PV device, the operating current value, and the open-circuit voltage value at the target irradiance value; and execute at least one programmatic action based on the series resistance value.

Example 2. The device of example 1, wherein executing the at least one programmatic action comprises: determining whether the series resistance value exceeds a threshold safety value; and if the series resistance value exceeds the threshold safety value, causing the PV device to be electrically disconnected from at least one electrical load.

Example 3. The device of any of examples 1-2, wherein executing the at least one programmatic action comprises: causing at least one of: the operating current value or the operating voltage value to be modified based on the series resistance value.

Example 4. The device of any of examples 1-3, wherein executing the at least one programmatic action comprises: outputting an indication of the series resistance value to at least one other device.

Example 5. The device of any of examples 1-4, wherein the PV device comprises a first PV device and wherein the at least one processor is further configured to determine the operating irradiance value by performing at least one of: receiving, from an irradiance sensor, an indication of the operating irradiance value; determining a short-circuit current value of a second PV device, and comparing the short-circuit current value of the second PV device to a reference short-circuit current value of the second PV device to determine the operating irradiance value; determining the short-circuit current value of the first PV device, and comparing the short-circuit current value of the PV device to a reference short-circuit current value of the first PV device to determine the operating irradiance value; or determining the operating irradiance value based on satellite weather data.

Example 6. The device of any of examples 1-5, wherein the at least one processor is configured to determine the open-circuit voltage value at the target irradiance value by: selecting, from a plurality of open-circuit voltage values of the PV device that were each measured within a time period, at least two open-circuit voltage values of the PV device that are associated with respective irradiance values of the PV device that are within a threshold of the target irradiance value, wherein the at least two open-circuit voltage values are associated with respective temperature values of the PV device; generating, based on the at least two open-circuit voltage values and at least one of the respective temperature values or the respective irradiance values, a model of the PV device that defines an open-circuit voltage of the PV device as a function of at least one of a temperature of the PV device or an irradiance on the PV device; and determining, using the model, the open-circuit voltage value based on at least one of an operating temperature value of the PV device or the operating irradiance value.

Example 7. The device of any of examples 1-6, wherein the device is a PV system controller.

Example 8. The device of any of examples 1-6, wherein the device is a PV system inverter.

Example 9. The device of any of examples 1-8, wherein the at least one processor is further configured to: receive at least a portion of an IV curve for the PV device, and determine at least one of: the operating current value, the operating voltage value, or the operating irradiance value based on the at least the portion of the IV curve.

Example 10. A method comprising: determining, by a processor, a target irradiance value based on an operating current value of a photovoltaic (PV) device, a short-circuit current value of the PV device, and an operating irradiance value of the PV device; determining, by the processor, an open-circuit voltage value of the PV device at the target irradiance value; determining, by the processor, a series resistance value of the PV device based on an operating voltage value of the PV device, the operating current value, and the open-circuit voltage value at the target irradiance value; and executing, by the processor, based on the series resistance value, at least one programmatic action to modify operation of the PV device.

Example 11. The method of example 10, wherein executing the at least one programmatic action comprises: determining, whether the series resistance value exceeds a threshold safety value; and if the series resistance value exceeds the threshold safety value, causing the PV device to be electrically disconnected from at least one electrical load.

Example 12. The method of any of examples 10-11, wherein executing the at least one programmatic action comprises: causing at least one of: the operating current value or the operating voltage value to be modified based on the series resistance value.

Example 13. The method of any of examples 10-12, wherein executing the at least one programmatic action comprises: outputting an indication of the series resistance value to at least one other device.

Example 14. The method of any of examples 10-13, wherein the PV device comprises a first PV device, the method further comprising determining the operating irradiance value by performing at least one of: receiving, from an irradiance sensor, an indication of the operating irradiance value; determining a short-circuit current value of a second PV device, and comparing the short-circuit current value of the second PV device to a reference short-circuit current value of the second PV device to determine the operating irradiance value; determining the short-circuit current value of the first PV device, and comparing the short-circuit current value of the first PV device to a reference short-circuit current value of the first PV device to determine the operating irradiance value; or determining the operating irradiance value based on satellite weather data.

Example 15. The method of any of examples 10-14, wherein determining the open-circuit voltage value at the target irradiance value comprises: selecting, from a plurality of open-circuit voltage values of the PV device that were each measured within a time period, at least two open-circuit voltage values of the PV device that are associated with respective irradiance values of the PV device that are within a threshold of the target irradiance value, wherein the at least two open-circuit voltage values are associated with respective temperature values of the PV device; generating, based on the at least two open-circuit voltage values and at least one of the respective temperature values or the respective irradiance values, a model of the PV device that defines an open-circuit voltage of the PV device as a function of at least one of a temperature of the PV device or an irradiance on the PV device; and determining, using the model, the open-circuit voltage value based on at least one of an operating temperature value of the PV device or the operating irradiance value.

Example 16. The method of any of examples 10-15, wherein the processor is part of a PV system inverter.

Example 17. The method of any of examples 10-15, wherein the processor is part of a PV system controller.

Example 18. The method of any of examples 10-17, further comprising: receiving at least a portion of an IV curve for the PV device, and determining at least one of: the operating current value, the operating voltage value, or the operating irradiance value based on the at least the portion of the IV curve.

Example 19. A non-transitory computer-readable medium encoded with instructions that, when executed, cause at least one processor to: determine a target irradiance value based on an operating current value of a photovoltaic (PV) device, a short-circuit current value of the PV device, and an operating irradiance value of the PV device; determine an open-circuit voltage value of the PV device at the target irradiance value; determine a series resistance value of the PV device based on an operating voltage value of the PV device, the operating current value, and the open-circuit voltage value at the target irradiance value; and execute at least one programmatic action based on the series resistance value.

Example 20. The non-transitory computer-readable medium of example 19, wherein executing the at least one programmatic action comprises: outputting an indication of the series resistance value to at least one other device.

According to one aspect of the present disclosure, a processor compares automatically-collected, low-irradiance, open-circuit voltage values to high-irradiance operating point voltage values. For example, a PV device may be momentarily switched to open-circuit during low-irradiance portions of the day, and the open-circuit voltage value $V'_{oc}$ may be measured. The measured voltages may be corrected for temperature and compared to the operating voltage value of the PV device while it is generating power during high-irradiance portions of the day. The series resistance value $R_s$ of the PV device may then be calculated based on the difference in voltage values and the operating current value.

According to another aspect of the present disclosure, a non-transitory computer-readable medium including computer instructions executable by a processor to cause the processor to perform the method discussed above is provided.

While the RTSR method may be performed using data from full or partial IV curves, it does not require the IV curves of a device, and thus the RTSR method described herein may improve the speed and/or accuracy of series resistance determination, allowing for real-time series resistance monitoring. Furthermore, because RTSR uses measurements of only a few points (e.g., points 2 and 4 shown in FIG. 1) to determine the series resistance, the techniques described herein may be implemented using simple sensors and reduced processing power, avoiding the need for expensive components or custom-hardware. Additionally, the series resistance can be a strong indicator of device condition, and increased series resistance or a sudden jump in series resistance can be a predictor of serious hardware problems. Thus, the techniques described herein may help improve system safety and better prevent catastrophic device failure.

As described herein, RTSR provides a physics-based method for real-time series resistance monitoring in PV systems and modules. The method may be used to analyze PV cells, modules, strings, electrical connections, microinverters, module integrated electronics, and/or any other suitable systems.

RTSR provides a method to continuously monitor PV systems for changes in series resistance associated with common failures including broken ribbons, failed solder bonds, or junction box contact issues. These issues can lead to fires, so early detection may be a critical concern. By automatically excluding or identifying changes in series resistance as the cause of performance decline, RTSR can benefit system operators by reducing the costs associated with hands-on inspections.

Related art methods of series resistance monitoring involve measurements of IV curves or empirical approaches requiring calibration. In contrast to methods involving IV curves, RTSR does not require moving away from the maximum power point during the high-irradiance portions of the day. Instead it compares maximum-power operating voltages to $V_{oc}$ values measured during a low-irradiance part of the day. This minimizes impacts on energy production. Furthermore, RTSR is physics-based and does not require calibration. By sampling only the recent history of the module for calculations RTSR automatically adapts to other (e.g., non-series resistance) changes in the modules, such as decreased shunt resistance, to provide accurate identification of series resistance changes.

RTSR allows the continuous, automatic monitoring of the series resistance of PV systems with high sensitivity, without disruption to the PV system's operation and without the need to measure IV curves. The RTSR method can be done using measurements from existing power electronics hardware, such as suitable microinverters, inverters, or power optimizers, or simple, permanently installed, stand-alone measurement equipment. RTSR is capable of early-stage detection of some of the most common field failures, including broken ribbons, failed solder bonds, and connector or combiner box problems. These failure modes present risk of both performance loss and fire due to increased ohmic dissipation.

RTSR is capable of detecting some of the most common reliability problems in PV systems with much higher sensitivity than the related art, which means the problems may be detected long before they have caused a substantial loss in power production. The systems and methods may be automated, so they do not rely on a human expert noticing the subtle signature of an incipient problem. Further, they will yield much richer streams of information, narrowing down the cause and location of problems so that targeted corrective action can be made without wasting resources. Even when there are no problems to detect, exemplary embodiments of the present invention may furnish reports showing with high confidence that failure is not imminent, increasing the value of the system by reducing uncertainty in its future output.

When used during commissioning and pre-sale inspection of PV arrays, at the request of investors and insurance companies, or continuously throughout a system's life, these systems and methods will provide timely module condition information that will inform decisions regarding financing and insurance costs, scheduling and targeting of maintenance, and warranty claims. Each of these decisions has the potential to reduce the cost of energy. After these tools are brought into mainstream use, cost-reducing inferences can be made for systems that have never been characterized based upon results from similar systems. This fleet-wide knowledge has the potential to reduce systematic risk for the entire PV market, thus reducing financing and insurance costs.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media, which includes any medium that facilitates transfer of a computer program from one place to another, e.g., according to a communication protocol. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable storage medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of inter-operative hardware units, including one or more processors as described above, in conjunction with suitable software and/or firmware.

The foregoing disclosure includes various examples set forth merely as illustration. The disclosed examples are not intended to be limiting. Modifications incorporating the spirit and substance of the described examples may occur to persons skilled in the art. These and other examples are within the scope of this disclosure and the following claims.

What is claimed is:

1. A device comprising:
   at least one processor configured to:
   determine, based on an operating current value of a photovoltaic (PV) device, a short-circuit current value of the PV device, and an operating irradiance value of the PV device, a target irradiance value, wherein determining the target irradiance value comprises:
     determining a ratio of the operating current value to the short-circuit current value, and
     scaling the operating irradiance value based on the ratio;
   determine an open-circuit voltage value of the PV device at the target irradiance value;
   determine, based on an operating voltage value of the PV device, the operating current value, and the open-circuit voltage value at the target irradiance value, a series resistance value of the PV device, wherein determining the series resistance value of the PV device comprises:
     determining a difference between the open-circuit voltage value at the target irradiance value and the operating voltage value, and
     scaling the difference based on the operating current value; and
   execute at least one programmatic action based on the series resistance value.

2. The device of claim 1, wherein executing the at least one programmatic action comprises:
   determining whether the series resistance value exceeds a threshold safety value; and
   if the series resistance value exceeds the threshold safety value, causing the PV device to be electrically disconnected from at least one electrical load.

3. The device of claim 1, wherein executing the at least one programmatic action comprises:
   causing at least one of: the operating current value or the operating voltage value to be modified based on the series resistance value.

4. The device of claim 1, wherein executing the at least one programmatic action comprises:
   outputting an indication of the series resistance value to at least one other device.

5. The device of claim 1, wherein the PV device comprises a first PV device and wherein the at least one processor is further configured to determine the operating irradiance value by performing at least one of:
   receiving, from an irradiance sensor, an indication of the operating irradiance value;
   determining a short-circuit current value of a second PV device, and comparing the short-circuit current value of the second PV device to a reference short-circuit current value of the second PV device to determine the operating irradiance value;
   determining the short-circuit current value of the first PV device, and comparing the short-circuit current value of the PV device to a reference short-circuit current value of the first PV device to determine the operating irradiance value; or
   determining the operating irradiance value based on satellite weather data.

6. The device of claim 1, wherein the at least one processor is configured to determine the open-circuit voltage value at the target irradiance value by:

selecting, from a plurality of open-circuit voltage values of the PV device that were each measured within a time period, at least two open-circuit voltage values of the PV device that are associated with respective irradiance values of the PV device that are within a threshold of the target irradiance value, wherein the at least two open-circuit voltage values are associated with respective temperature values of the PV device;

generating, based on the at least two open-circuit voltage values and at least one of the respective temperature values or the respective irradiance values, a model of the PV device that defines an open-circuit voltage of the PV device as a function of at least one of a temperature of the PV device or an irradiance on the PV device; and determining, using the model, the open-circuit voltage value based on at least one of an operating temperature value of the PV device or the operating irradiance value.

7. The device of claim 6, wherein determining the series resistance value comprises determining $$\frac{V'_{OC}(T) - V_0}{I_O},$$

wherein:
$V_{OC}'(T)$ represents the open-circuit voltage value at the target irradiance, as determined based on the at least one of an operating temperature value of the PV device or the operating irradiance value,
$V_0$ represents the operating voltage value, and
$I_0$ represents the operating current value.

8. The device of claim 1, wherein the device is a PV system controller.

9. The device of claim 1, wherein the device is a PV system inverter.

10. The device of claim 1, wherein the at least one processor is further configured to:
receive at least a portion of an IV curve for the PV device, and
determine at least one of: the operating current value, the operating voltage value, or the operating irradiance value based on the at least the portion of the IV curve.

11. The device of claim 1, wherein determining the target irradiance value comprises determining $$E_0\left(1 - \frac{I_0}{I_{SC,0}}\right),$$

wherein:
$E_0$ represents the operating irradiance value,
$I_0$ represents the operating current value, and
$I_{SC,0}$ represents the short-circuit current value.

12. The device of claim 1, wherein determining the series resistance value comprises determining $$\frac{V_{OC} - V_0}{I_O},$$

wherein:
$V_{OC}$ represents the open-circuit voltage value at the target irradiance value,
$V_0$ represents the operating voltage value, and
$I_0$ represents the operating current value.

13. A method comprising:
determining, by a processor, based on an operating current value of a photovoltaic (PV) device, a short-circuit current value of the PV device, and an operating irradiance value of the PV device, a target irradiance value, wherein determining the target irradiance value comprises:
determining a ratio of the operating current value to the short-circuit current value, and
scaling the operating irradiance value based on the ratio;
determining, by the processor, an open-circuit voltage value of the PV device at the target irradiance value;
determining, by the processor, based on an operating voltage value of the PV device, the operating current value, and the open-circuit voltage value at the target irradiance value, a series resistance value of the PV device, wherein determining the series resistance value of the PV device comprises:
determining a difference between the open-circuit voltage value at the target irradiance value and the operating voltage value, and
scaling the difference based on the operating current value; and
executing, by the processor, based on the series resistance value, at least one programmatic action to modify operation of the PV device.

14. The method of claim 13, wherein executing the at least one programmatic action comprises:
determining, whether the series resistance value exceeds a threshold safety value; and
if the series resistance value exceeds the threshold safety value, causing the PV device to be electrically disconnected from at least one electrical load.

15. The method of claim 13, wherein executing the at least one programmatic action comprises:
causing at least one of: the operating current value or the operating voltage value to be modified based on the series resistance value.

16. The method of claim 13, wherein executing the at least one programmatic action comprises:
outputting an indication of the series resistance value to at least one other device.

17. The method of claim 13, wherein the PV device comprises a first PV device, the method further comprising determining the operating irradiance value by performing at least one of:
receiving, from an irradiance sensor, an indication of the operating irradiance value;
determining a short-circuit current value of a second PV device, and comparing the short-circuit current value of the second PV device to a reference short-circuit current value of the second PV device to determine the operating irradiance value;
determining the short-circuit current value of the first PV device, and comparing the short-circuit current value of the first PV device to a reference short-circuit current value of the first PV device to determine the operating irradiance value; or
determining the operating irradiance value based on satellite weather data.

18. The method of claim 13, wherein determining the open-circuit voltage value at the target irradiance value comprises:
selecting, from a plurality of open-circuit voltage values of the PV device that were each measured within a time period, at least two open-circuit voltage values of the PV device that are associated with respective irradiance values of the PV device that are within a threshold of the target irradiance value, wherein the at least two open-circuit voltage values are associated with respective temperature values of the PV device;

generating, based on the at least two open-circuit voltage values and at least one of the respective temperature values or the respective irradiance values, a model of the PV device that defines an open-circuit voltage of the PV device as a function of at least one of a temperature of the PV device or an irradiance on the PV device; and determining, using the model, the open-circuit voltage value based on at least one of an operating temperature value of the PV device or the operating irradiance value.

19. The method of claim 13, further comprising:

receiving at least a portion of an IV curve for the PV device, and determining at least one of: the operating current value, the operating voltage value, or the operating irradiance value based on the at least the portion of the IV curve.

20. A non-transitory computer-readable medium encoded with instructions that, when executed, cause at least one processor to:

determine, based on an operating current value of a photovoltaic (PV) device, a short-circuit current value of the PV device, and an operating irradiance value of the PV device, a target irradiance value, wherein determining the target irradiance value comprises:

determining a ratio of the operating current value to the short-circuit current value, and scaling the operating irradiance value based on the ratio;

determine an open-circuit voltage value of the PV device at the target irradiance value;

determine, based on an operating voltage value of the PV device, the operating current value, and the open-circuit voltage value at the target irradiance value, a series resistance value of the PV device, wherein determining the series resistance value of the PV device comprises:

determining a difference between the open-circuit voltage value at the target irradiance value and the operating voltage value, and scaling the difference based on the operating current value; and execute at least one programmatic action based on the series resistance value.

* * * * *